(12) United States Patent
Krassnitzer (10) Patent No.: US 10,458,015 B2
(45) Date of Patent: Oct. 29, 2019

(54) REACTIVE SPUTTERING PROCESS

(71) Applicant: Oerlikon Trading AG, Trubbach, Trubbach (CH)

(72) Inventor: Siegfried Krassnitzer, Feldkirch (AT)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 431 days.

(21) Appl. No.: 14/362,758

(22) PCT Filed: Nov. 23, 2012

(86) PCT No.: PCT/EP2012/004848
§ 371 (c)(1),
(2) Date: Jun. 4, 2014

(87) PCT Pub. No.: WO2013/083238
PCT Pub. Date: Jun. 13, 2013

(65) Prior Publication Data
US 2014/0311892 A1    Oct. 23, 2014

Related U.S. Application Data

(60) Provisional application No. 61/566,836, filed on Dec. 5, 2011.

(51) Int. Cl.
*C23C 14/34* (2006.01)
*H01J 37/34* (2006.01)
*C23C 14/00* (2006.01)

(52) U.S. Cl.
CPC ...... *C23C 14/3485* (2013.01); *C23C 14/0094* (2013.01); *C23C 14/3492* (2013.01); *H01J 37/3467* (2013.01); *H01J 37/3485* (2013.01)

(58) Field of Classification Search
CPC ............. C23C 14/3492; C23C 14/542; C23C 14/3485; C23C 14/0094; C23C 14/0089; H01J 37/3467; H01J 37/3485
See application file for complete search history.

(56) References Cited

U.S. PATENT DOCUMENTS 5,015,493 A * 5/1991 Gruen ............... C23C 14/32
  204/298.05
6,511,584 B1 * 1/2003 Szczyrbowski ..... C23C 14/0036
  204/192.12

(Continued)

FOREIGN PATENT DOCUMENTS

DE    10 2006 017 382 A1    5/2007
DE    20 2010 001 497 U1    4/2010

(Continued)

OTHER PUBLICATIONS

International Search Report issued in Application No. PCT/EP2012/004848 dated May 2, 2013.

*Primary Examiner* — Michael A Band
(74) *Attorney, Agent, or Firm* — Pearne & Gordon LLP (57) ABSTRACT

Reactive sputtering in which, by ion bombardment, material is ejected from the surface of a target and transitions to the gas phase. Negative voltage pulses are applied to the target to establish electric current having a current density greater than 0.5 A/cm² at the target surface, such that the material transitioning to the gas phase is ionized. Reactive gas flow is established and reacts with the material of the target surface. Voltage pulse duration is such that, during the pulse, the target surface where the current flows is at least partly covered most of the time with a compound composed of reactive gas and target material and, consequently, the target surface is in a first intermediate state, and this covering is smaller at the end of the voltage pulse than at the start and, consequently, the target surface is in a second intermediate state at the end of the voltage pulse.

10 Claims, 6 Drawing Sheets

(56) References Cited

U.S. PATENT DOCUMENTS

| | | | | |
|---|---|---|---|---|
| 2005/0098430 A1* | 5/2005 | Tuymer | ............ | H01J 37/32027 |
| | | | | 204/298.08 |
| 2009/0173622 A1* | 7/2009 | Weichart | ............. | C23C 14/0036 |
| | | | | 204/192.22 |
| 2011/0248633 A1* | 10/2011 | Nauman | ............. | C23C 14/3485 |
| | | | | 315/111.21 |
| 2013/0276984 A1 | 10/2013 | Papa | | |

FOREIGN PATENT DOCUMENTS

| | | |
|---|---|---|
| EP | 1 553 206 A1 | 7/2005 |
| WO | 03/006703 A1 | 1/2003 |
| WO | 2007/054048 A1 | 5/2007 |
| WO | 2007/147582 A1 | 12/2007 |
| WO | 2009/001330 A2 | 12/2008 |
| WO | 2009/071667 A1 | 6/2009 |
| WO | 2012/143091 A1 | 10/2012 |

* cited by examiner

REACTIVE SPUTTERING PROCESS

The present invention relates to a method for reactive sputtering. During sputtering, which is also known as cathodic sputtering, material is ejected by means of on bombardment from the surface of a solid body (target), which constitutes the cathode, and undergoes transition to the gas phase. A negative potential is applied to the cathode in order to accelerate the provided ions onto it. Sputtering is often used for coating substrates. The substrates are brought close to the target or lead past it. The gaseous material knocked out sputtered) from the cathode is then deposited onto the substrates. In this case, it is a deposition from the gas phase and it belongs to the coating processes known under the name PVD (=physical vapor deposition). In order for the sputtered material to reach the substrates undisturbed, i.e. without colliding with other particles, only a low ambient gas pressure may be present. The average free path length should be at least as long as the distance from the cathode to the substrates. Sputter coating is thus performed in a process chamber that can be evacuated. Typical process pressures are $5*10^{-3}$ mbar or lower.

In order to generate the ions necessary for bombarding the cathode, an inert working gas is introduced into the process chamber. Argon is very often used as working gas. Impact ionization causes the atoms of the working gas to become ionized. During impact ionization, free electrons essentially collide with the atoms and ionize the latter, in this manner, a plasma is formed, out of which the ions can be attracted by the cathode. A high electron density is thus beneficial to the process. In the case of so-called magnetron sputtering, a magnet system is placed behind the cathode and whose magnetic field extends into the area above the target surface. This projecting part of the magnetic field, which is often executed as tunnel and, in the case of rectangular cathodes, is often reminiscent of the shape of a racetrack, forces the electrons onto a spiral path. By thus causing the path length to be increased, the number of collisions per electron is increased and the working gas atoms are ionized more efficiently.

Because of the negative voltage applied to the cathode, the working gas ions are accelerated towards the latter. During the sputtering, a current flow is thus generated that must be maintained by a powerful generator. In the classical sputtering process, the degree of ionization of the material ejected from the target is very low. However, if using current densities greater than 0.5 A/cm², the degree of ionization increases dramatically. This ionization of the sputtered material can advantageously be used for the layer composition. However, the high current density at the target results in a considerable energy input into the target and thus causes the latter to overheat. For this reason, only pulses are used at such current densities in order to give the target time to cool down. Such a process is called high-power impulse magnetron sputtering (HiPIMS).

Due to the electric current that inevitably flows through the target surface during the process, the sputtering method is limited to electrically conducting materials. Nevertheless, a reactive gas can be introduced into the process chamber during the sputtering, which then forms a bond with the sputtered material. However, from a certain flow of reactive gas onwards, this results in a drastic rate drop. This is a sign that the target surface, as a result of the reaction of the reactive gas with the target material, is covered with a non-conductive or poorly conductive layer. In this case, it is called a poisoned target. The so-called metallic state can be reestablished only by means of a drastic reduction in the supply of reactive gas.

Figure 1:
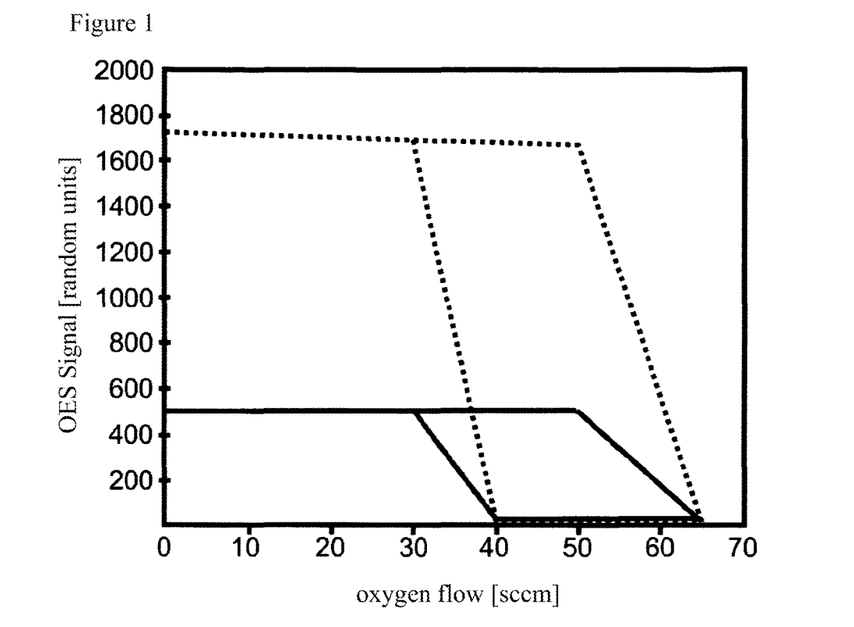
FIG. 1 shows a typical hysteresis according to the state of the art.

FIG. 1 shows a typical hysteresis using the example of the optical signals for Al and chromium for short impulse durations (70 µs) of a HiPIMS discharge. The impulse power in this respect was 500 W/cm² and the output averaged over time was 2.5 kW. The solid lines indicate the optical signals for chromium (520 nm), the dotted lines indicate the optical signals for aluminum (396 nm). The top lines are linked to a rising oxygen flow, the lower lines are linked to a falling oxygen flow. The rate drop from a critical oxygen flow can be clearly seen. In this respect, the rate in poisoned mode drops to very low values, i.e. becomes approximately smaller by a factor of 100 than the rate in the metallic mode. In the poisoned mode, the target surface is oxidized. It is only by drastically reducing the oxygen flow that the target surface can be restored to the metallic mode again.

There have been various attempts to avoid such hysteresis. In WO03/006703, Nyberg et al. propose a method for reactive sputtering that generates a high current density on the sputter target by means of a spatial limitation of the plasma racetrack. In this manner, the plasma is restricted to a small area of the target surface. Nyberg et al, describe that it is important to move this area and this has to be done on the one hand slowly enough to ensure that sputtering occurs mostly in the metallic mode, yet on the other hand fast enough to prevent the target surface from melting.

In contrast thereto, Wallin et al, describe in WO2009/01330 a HiPIMS method according to which pulses are used that have an impulse length between 2 µs and 200 µs. Voltages are used that are between 200V and 2000V. Power densities are used that are above 200 Wcm⁻². A generator comprising a pulse unit supplies the corresponding power impulses. In this way, during each impulse, a magnetron sputtering glow discharge with an increasing current rising to a maximum is triggered, during which the maximum of the power impulse is achieved. Between two consecutive Impulses, no electric power is supplied into the coating system. Oxygen flows are used that are between 200 sccm and 2000 sccm. As Wallin et al. describe, reactive conditions are thus achieved on the substrate to be coated, wherein simultaneously the target is essentially in the metallic state, i.e. the target surface is not significantly covered with reactive gas.

Both Nyberg et al. and Wallin et al. thus choose the process parameters such that sputtering occurs from the target in a metallic mode. The present invention takes a different approach. It describes a method for operating a sputter discharge in combination with high current densities (HiPIMS) that are greater than 0.5 A/cm². Starting with a target that at the beginning of the power impulse is in an intermediate state between a poisoned and a metallic state, in the inventive method the current density resp. the sputter power density thus achieved in combination with the impulse duration is chosen such that the reactive sputtering process at the end of the power impulse is in a second intermediate state between a poisoned and a metallic state, wherein the second intermediate state has a clearly more metallic character than the first intermediate state. The first intermediate state in this respect can also be the completely poisoned state and the second intermediate state can also be the metallic state. However, the first intermediate state preferably clearly does not correspond to the absolutely poisoned state and/or the second intermediate state clearly does not correspond to the essentially metallic state. It is however essential that, unlike the state of the art, sputtering is not performed mostly from a target in the metallic state but, according to the invention, by applying a defined energy impulse the state progresses during the pulse from a more or less poisoned target to a more metallic target, in this respect, on the one hand the high current density existing at the target in the HiPIMS process has a supportive effect and, on the other hand, an impulse must last sufficiently long in order to effectively render the target at least partially less poisoned. The impulse pause is then selected to be as long or short that the poisoning of the target corresponds to the first intermediate state. With the subsequent impulse, the target is then made less poisoned again until the second intermediate state. An inventive impulse duration is between 50 µs and 100 ms. The actual effect stabilizing the process will however occur above approx. 500 µs. The preferred impulse duration according to the invention is thus between 500 µs and 100 ms, with an impulse duration between 1 ms and 10 ms is particularly preferred and an impulse duration between 1 ms and 5 ms has further advantages.

As described above, according to the invention a defined energy impulse is applied. This can be achieved for example in that, contrary to the above-mentioned state of the art, the power supply in the coating system between two consecutive impulses at a target is not interrupted but rather power is applied to several targets consecutively, so that the power output in the coating system over several impulse sequences remains essentially uninterrupted and constant. Since there is no interruption of the power supply during these impulse sequences, no further power buildup intervals are necessary either. It is thus possible to use a simple DC generator that provides its power to the coating system constantly over several impulses. As a result, very well defined and reproducible power impulses can be achieved at the individual targets. Such a method for supplying sequential power impulses is described for example in WO2012/143091 by the same applicant. The object of WO2012/143091 is hereby incorporated into this description by reference.

As a result of the inventive method, a very stable process without hysteresis of the sputter discharge resp. of the reactive gas pressure as well as a high coating rate can be achieved. This applies in particular in the case of oxide sputtering processes such as for example the production of aluminum oxide. A further advantage of the method is the high current density of the inventive sputter discharge, which increases the ionization of the sputtered particles.

The invention will now be described in detail and on the basis of the figures by way of example.

Figure 2:
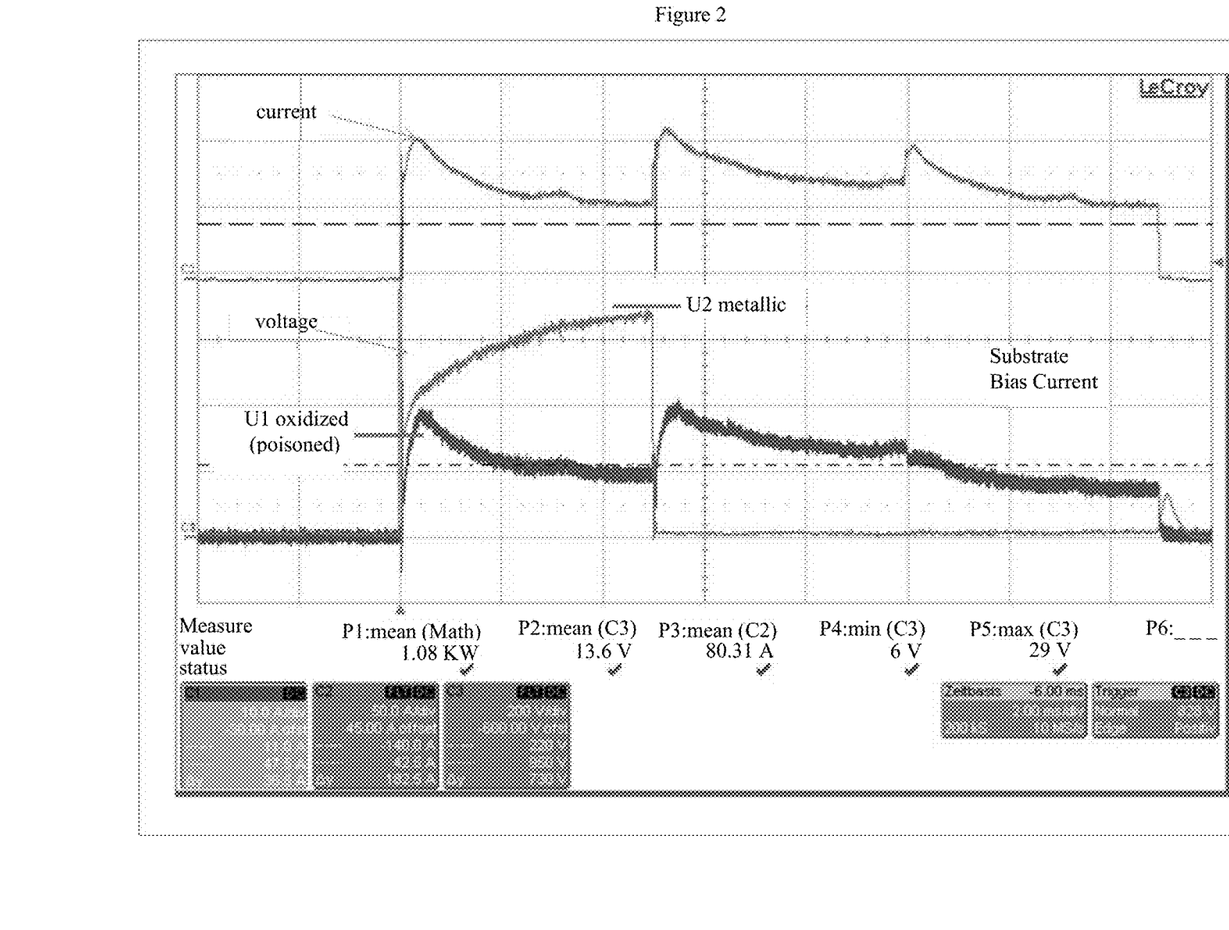
FIG. 2 shows a screenshot of an inventive power impulse at a sputter cathode.

FIG. 2 represents an inventive power impulse at a sputter cathode. In this example, an AlCr (70:30) target was used as target material and an oxygen flow of 40 sccm was maintained. The figure shows that the discharge voltage reacts very sensitively to the poisoning of the target surface in the sputtering racetrack:

at the beginning of the power impulse, the voltage level $U1=400V$, This can be referred to as a poisoned (in the example oxidized) target;

at the end of the power impulse, which is kept constant at 500 W/cm$^2$, the voltage level $U2=680V$ corresponds to a partly oxidized state of the target surface.

From this, the conclusion can be drawn that the target surface portion corresponding to the plasma racetrack undergoes for the duration of the impulse a transition from being initially oxidized to an intermediate state to partly oxidized resp. metallic.

Figure 3:
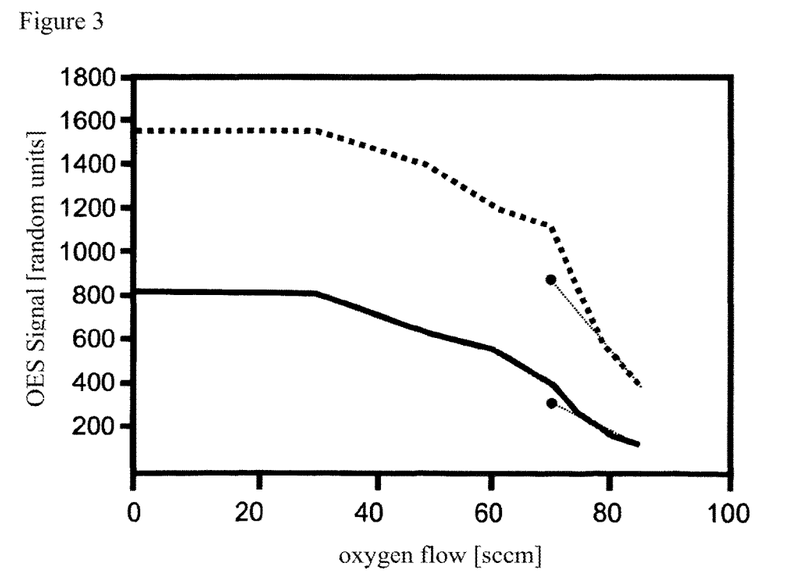
FIG. 3 shows the rate drop in a reactive process with oxygen as a reactive gas when using long HiPIMS impulses.

If long HiPIMS impulses are used, such as for example 5 ms with an impulse power of again 500 W, a continuous rate drop appears as the flow of reactive gas (e.g. oxygen) increases (see FIG. 3). Surprisingly, the rate drop is monotonous and there is no hysteresis behavior. This creates the possibility of using the inventive method to adjust the operating point at will at a state of the target.

Figure 4:
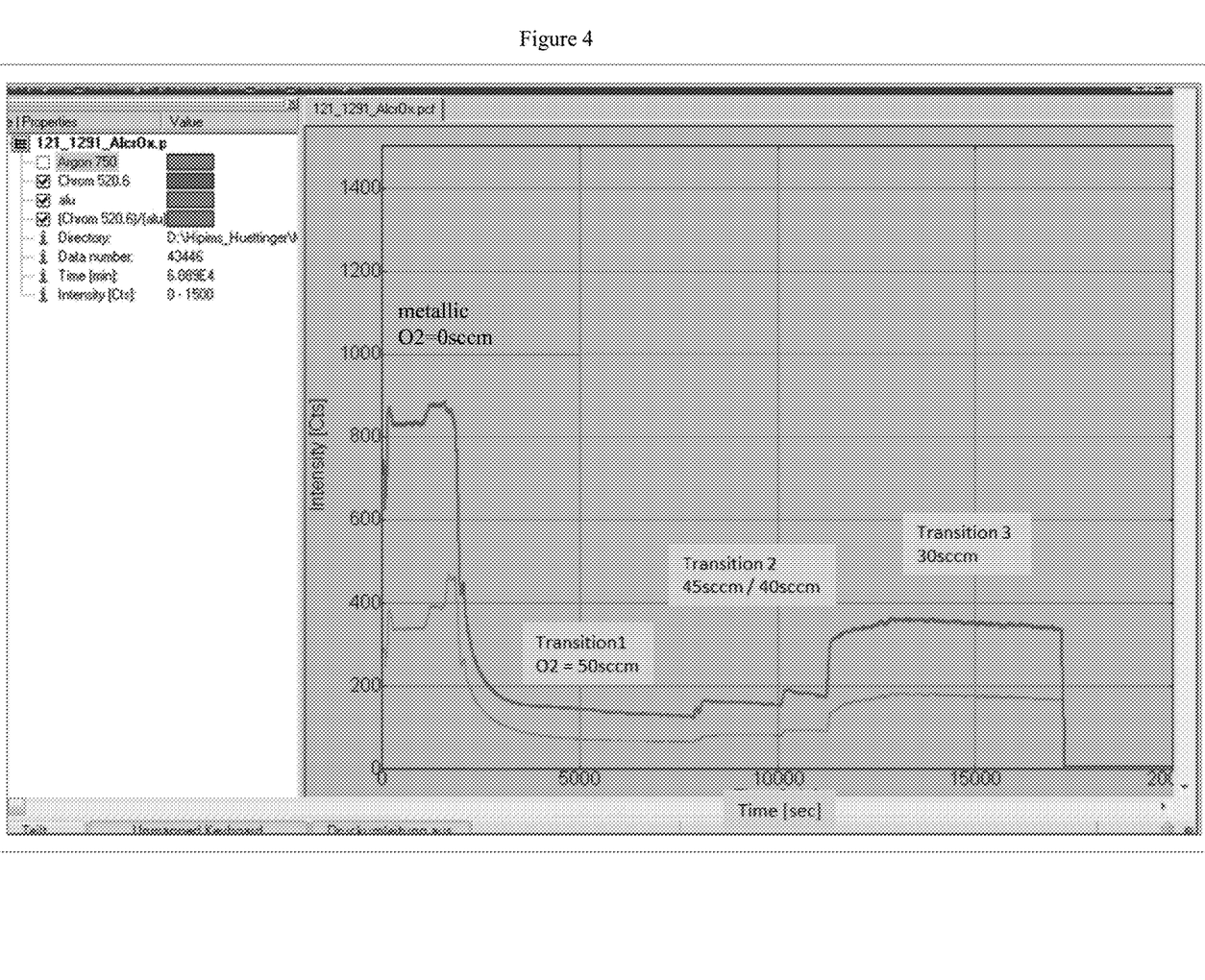
FIG. 4 shows the evolution of the optical signal in a 5-hour long coating process.
Figure 5A:
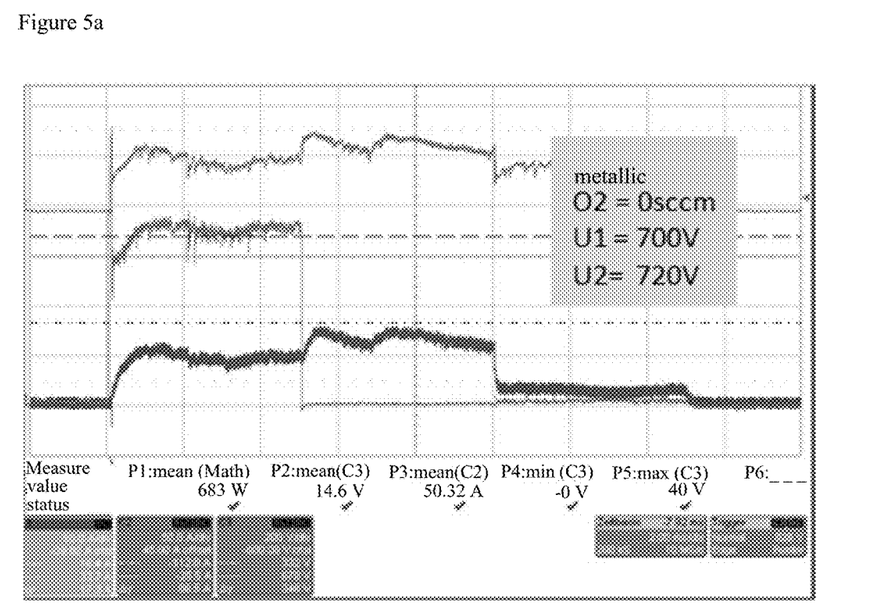
FIGS. 5a to d show the evolution of the voltage and current pulses at different operating points.
Figure 5B:
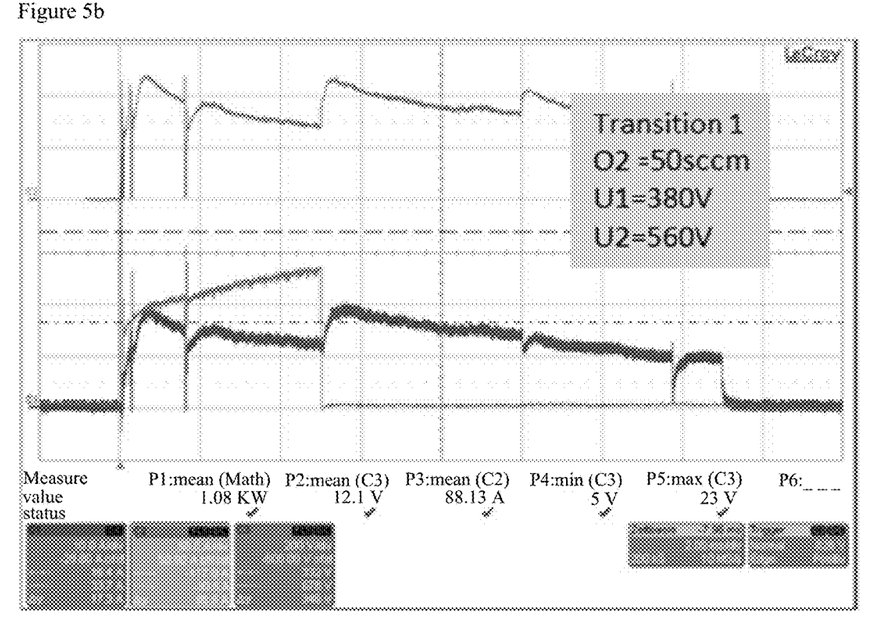
Figure 5C:
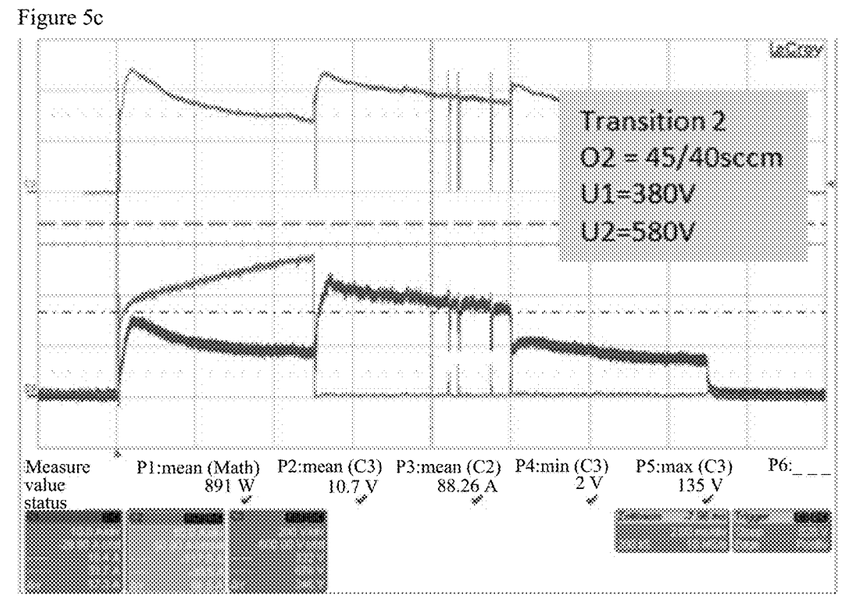
Figure 5D:
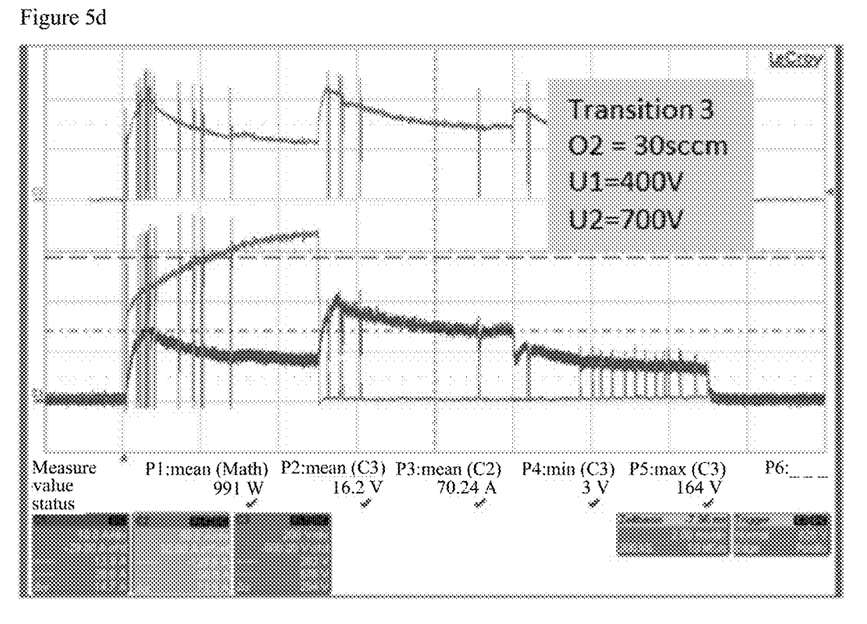
Figure 6:
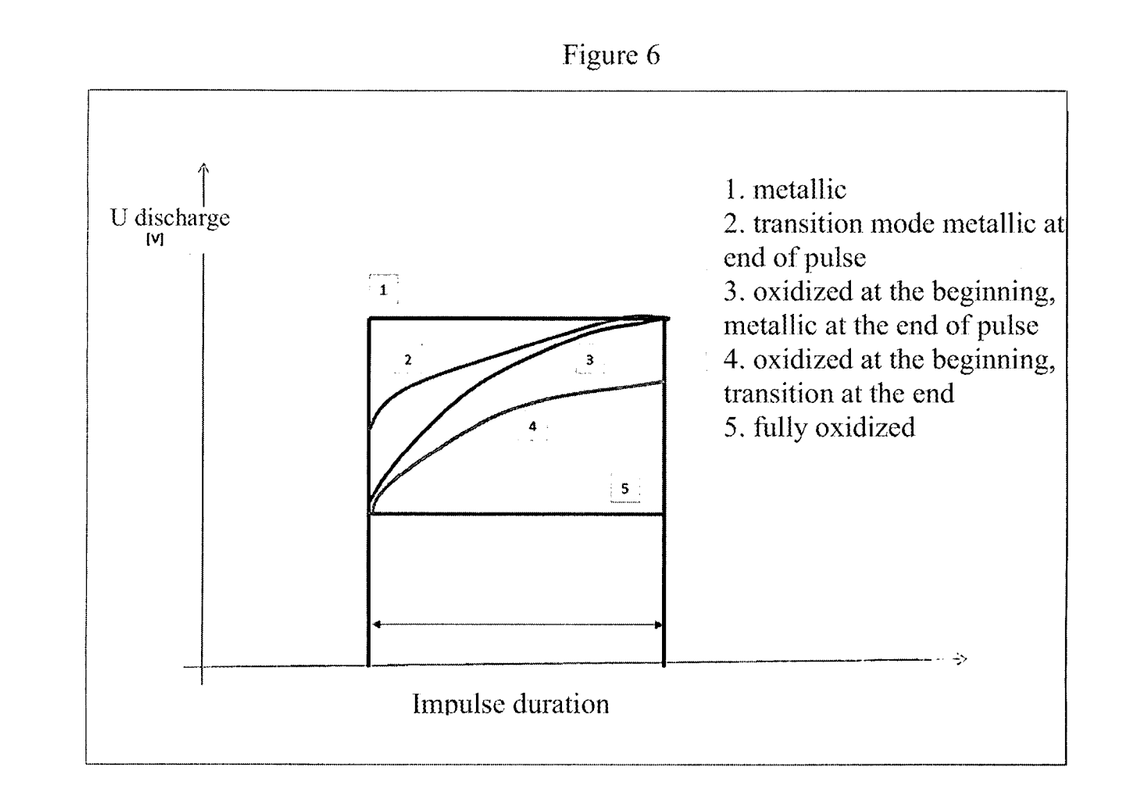
FIG. 6 is a representation of the possibility of regulating the reactive sputtering process on the basis of voltage values.

The inventive method proves exceptionally stable. In order to demonstrate this, the coating process was maintained for 5 hours with the above-mentioned parameters, and during this time different oxygen flows and thus operating points were chosen. It started with a metallic layer, followed by different sections with different oxygen flows. FIG. 4 shows the evolution of the optical signal of the HiPIMS plasma emission on the basis of the emission lines of aluminum and chromium as a factor of time. It can be clearly seen that the coating process takes place in a very stable manner throughout the entire time.

By way of complement, FIG. 5 shows the evolution of the voltage and current pulses at the different operating points of the diagram shown in FIG. 4. In FIG. 5a, the processes are shown when no reactive gas is admitted into the chamber. The purely metallic mode is achieved. The voltage remains relatively constant. The same applies for the current. In FIG. 5b, there is a reactive gas flow of 50 sccm. The discharge voltage starts at 380V and ends at 560V, The metallic state of the target surface is thus not achieved at all. In FIG. 5b, there is a reactive gas flow first of 45 sccm and then 40 sccm. The discharge voltage at the end of the impulse has now increased to 580V, the value given by a metallic surface is however not yet reached. In FIG. 5d, finally, there is a reactive gas flow of 30 sccm. At this reactive gas flow value, the discharge voltage is initially 400V and at the end of the impulse it is 700V, i.e. at the end of the impulse presumably the metallic state of the target surface is essentially reached. In this respect, it becomes clear that as the oxidation of the target surface increases, the initial value of the discharge voltage of the power impulse drops. The duration of the high-power impulse ensures that at the end of the power impulse, the target takes on a state in the transition zone between oxidized and metallic or is metallic, since in the event of total oxidation of the target surface, the voltage would remain constant at the low initial value. In contrast to the state of the art, however, the invention proceeds differently in that during the impulse, most of a metallic target surface is sputtered.

The inventive method discloses furthermore the possibility of a new and also inventive regulation of the reactive process.

According to the state of the art known to date, regulation is performed in fact either by means of the optical emission or by means of a sputter voltage being kept constant. Both methods make it possible to work in a stable fashion in the transition zone of a reactive process. The voltage regulation in particular is generally a simple, stable and very sensitive process.

The discharge voltage of an oxidized target surface for e.g. aluminum oxide or $AlCrO_x$ is in the range of 300 to 400V. The voltage in the case of partial oxidation is accordingly higher and the voltage for metallic sputtering is approx. 600 to 800V. According to the invention, this can, in the case of a method with an essentially constant power supply during the power impulse, be advantageously used for regulating the reactive process. According to the invention, the process can indeed by regulated by means of the initial value of the voltage and the end value of the voltage of a power impulse. This means that the sputtering process is regulated on the basis of the voltage value at the beginning of a HiPIMS power impulse and the respective voltage value at the end of the power impulse. This is represented diagrammatically in FIG. 5.

The impulse power and the impulse duration of a reactive HiPIMS sputtering process can therefore be selected according to the invention that at the beginning of the impulse, a specific, more strongly oxidized target state occurs, whilst at the end of the impulse, a specific, at least less strongly oxidized target state occurs, wherein this is visible in the evolution of the voltage.

It should be noted that as a reactive gas for the inventive method for example oxygen, nitrogen, $C_2H_2$, $CH_4$ and their mixtures may be considered.

It is thus possible in the inventive sputtering with oxygen to add for example nitrogen as second reactive gas.

For the inventive sputtering with nitrogen, for example $C_2H_2$ or $CH_4$ can be added as second reactive gas.

A method for reactive sputtering has been disclosed in which, by means of on bombardment, material is ejected from the surface of a first target and undergoes transition to the gas phase, wherein negative voltage is applied pulse-wise to the target in such a way that an electric current having a current density of greater than 0.5 A/cm$^2$ occurs at the target surface, such that the material undergoing transition to the gas phase is at least partly ionized, and in which a reactive gas flow is established and reactive gas reacts with the material of the target surface. The duration of a voltage pulse is chosen such that, during the voltage pulse, the target surface, at the location or locations at which the current flows, most of the time is covered at least partly with a compound composed of reactive gas and target material and, consequently, the target surface is in a first intermediate state, and this covering is smaller at the end of the voltage pulse than at the start of the voltage pulse and, consequently, the target surface is in a second intermediate state at the end of the voltage pulse.

The power impulse generated by the voltage and the current can be maintained at least for most of the duration of the impulse, preferably for essentially the entire impulse duration, at an essentially constant power amplitude.

The impulse duration can be between 500 μs and 100 ms, preferably between 1 ms and 10 ms and even more preferably between 1 ms and 5 ms.

The interruption time or times between a first impulse and a later impulse can be chosen in such a way that in this time, the reactive gas reacts with the target surface to the point that at the beginning of the following impulse, the target surface in terms of coverage has essentially the same intermediate state as at the beginning of the first impulse. The later impulse can be an impulse directly following the first impulse, i.e. so no further impulse occurs in-between.

At least a second target can be used and for the pulse-wise application of voltage, the power input can be switched sequentially from the first target to the second target and if necessary sequentially to the further targets, so that during at least one such sequence, the power input of a generator supplying the power, which is preferably a DC generator, is not interrupted.

The reactive sputtering method can be regulated in such a way that when a predetermined voltage correlating with a second intermediate state of the target surface is reached, a voltage pulse is ended.

The regulating process can be designed in such a way that in the event that a predetermined voltage at the beginning of an impulse is not reached, the interruption time is chosen to be shorter than the previous interruption time and in the event that a predetermined voltage at the beginning of an impulse is exceeded, the interruption time is chosen to be longer than the previous interruption time.

The second intermediate state can essentially be the metallic state or not the metallic state of the target surface.

The sputtering method described above is preferably used for coating substrates. Due to the high on density, however, it can also be used in other processes such as for example sputter etching, surface cleaning or on implantation.

What is claimed is:

1. Method for reactive sputtering in which, by means of ion bombardment, material is ejected from the surface of a first target and undergoes transition to a gas phase,
wherein negative voltage is applied pulse-wise to the first target to generate a voltage pulse in such a way that an electric current having a current density of greater than 0.5 A/cm$^2$ occurs at a first target surface of the first target, such that the material undergoing transition to the gas phase is at least partly ionized, and in which a reactive gas flow is established and reactive gas reacts with the material of the first target surface,
wherein a duration of the voltage pulse is chosen such that, during the voltage pulse, the first target surface is in a first intermediate state at the start of the voltage pulse and, in a second intermediate state at the end of the voltage pulse,
wherein the second intermediate state is more metallic and less poisoned than the first intermediate state, and
wherein interruption times between a first impulse and a later impulse at the first target are chosen in such a way that in this time, the reactive gas reacts with the first target surface to a point that at a beginning of the later impulse, the first target surface in terms of coverage has essentially the same intermediate state as at a beginning of the first impulse and the later impulse is an impulse directly following the first impulse, in such a way that no further impulse occurs in-between the first impulse and the later impulse.

2. Method according to claim 1, characterized in that the duration of the voltage pulse is between 500 μs and 100 ms.

3. Method according to claim 1, characterized in that the second intermediate state is essentially the metallic state or not the metallic state of the first target surface.

4. Method according to claim 1, wherein the duration of the voltage pulse is between 1 ms and 10 ms.

5. Method according to claim 1, wherein the duration of the voltage pulse is between 1 ms and 5 ms.

6. Method according to claim 1, wherein the negative voltage is supplied by a DC generator.

7. Method according to claim 1, wherein the voltage pulse increases from a first discharge voltage when the first target surface is in the first intermediate state to a second discharge voltage that is higher than the first discharge voltage when the first target surface is in the second intermediate state that is less poisoned and more metallic than the first intermediate state.

8. Method according to claim 1, wherein a second target is used and the voltage pulse is applied such that a power input is switched sequentially from the first target to the second target, so that during at least one such sequence, the power input supplied from a generator is not interrupted.

9. Method according to claim 1, wherein, at a location or locations on the first target surface where the electric current flows, a compound composed of the reactive gas and the material at least partly covers the first target surface and the location or locations covered by the compound is smaller in the second intermediate state at the end of the voltage pulse than in the first intermediate state.

10. Method according to claim 1, wherein power generated by the voltage pulse and the electric current is maintained at a constant value for the duration of the voltage pulse by adjusting the voltage and inversely adjusting the electric current.

* * * * *